United States Patent [19]

Iwamatsu

[11] 4,121,169
[45] Oct. 17, 1978

[54] AMPLIFIER DEVICE
[75] Inventor: Masayuki Iwamatsu, Hamamatsu, Japan
[73] Assignee: Nippon Gakki Seizo Kabushiki Kaisha, Japan
[21] Appl. No.: 759,123
[22] Filed: Jan. 13, 1977
[30] Foreign Application Priority Data
  Jan. 19, 1976 [JP] Japan .............................. 51-3373[U]
[51] Int. Cl.² .............................................. H03F 3/04
[52] U.S. Cl. ............................. 330/296; 330/253; 330/261
[58] Field of Search ................. 330/69, 253, 259, 260, 330/261, 296

[56] References Cited
U.S. PATENT DOCUMENTS

| 3,641,448 | 2/1972 | Steckler | 330/18 |
| 3,660,773 | 5/1972 | Free | 330/30 D |
| 3,938,055 | 2/1976 | Buhler | 330/69 X |

Primary Examiner—Lawrence J. Dahl
Attorney, Agent, or Firm—Charles W. Helzer

[57] ABSTRACT

An amplifier device comprises a pair of cascode connected transistors wherein the base of the first transistor is connected to an input terminal, the emitter is grounded through a resistor, the collector is connected to the emitter of the second transistor, the collector of the second transistor is connected to a source through a resistor and to an output terminal, and the base of the second transistor is connected to the emitter of the first transistor via a biasing circuitry. The voltage drop between the collector and the emitter of the first transistor is kept constant irrespective of the input signal voltage. The amplifier operates stably with a small deformation of the waveform.

14 Claims, 7 Drawing Figures

4,121,169

AMPLIFIER DEVICE

BACKGROUND OF THE INVENTION

This invention relates to an amplifier device.

An amplifier device, for example, a cascode amplifier is constituted by a pair of cascode connected transistors in which a transistor of the second stage having a low input impedance with a base electrode grounded acts as a load of a transistor of the first stage having an emitter electrode grounded so that it can provide a stable amplifier action and an improved frequency characteristic. Accordingly, the cascode amplifier is widely used as a high frequency amplifier in a frequency modulated tuner or the like.

As shown in FIG. 1, a prior art cascode amplifier comprises an input terminal adapted to receive an input signal, an output terminal 12, a first stage transistor 14 with its emitter electrode grounded, a second stage transistor 15 with its base electrode grounded, and a bias source 16 having a voltage of E connected between the base electrode of the transistor 15 and the ground. The emitter electrode of the transistor 14 is connected to the ground through an emitter resistor 18, while the collector electrode of transistor 15 is connected to a positive terminal 21 of a source having a voltage of $+V$ via a collector resistor 19 and to the output terminal 12. $I_C$ shows the collector current of the transistor 15. The bias source 16 has a voltage so as to ground the base electrode of the second stage transistor 15 and to provide a sufficiently wide dynamic range at a time of a large amplitude and at a time of the variation in the voltage of the source.

In the cascode amplifier described above an input signal applied to the input terminal 10 is amplified by the first and second transistors 14 and 15 respectively to obtain an amplified output as the output terminal 12.

There is a following relationship between the base-emitter voltage $V_{BE2}$ of the transistor 15, the collector-emitter voltage $V_{CE1}$ of the transistor 14, the resistance $R_E$ of the emitter resistor 18, the collector current $I_C$ and the source voltage E.

$$E = V_{BE2} + V_{CE1} + I_C R_E \quad (1)$$

Thus, $$V_{CE1} = E - V_{BE2} - I_C R_E \quad (2)$$

Since $V_{BE2}$ of transistor 15 and the voltage E of the bias source 16 may be considered substantially constant, the variation $\Delta V_{CE1}$ of the collector-emitter voltage $V_{CE1}$ of the first stage transistor 14 when the collector current $I_C$ varies in accordance with the input signal can be derived from equation (2) as follows.

$$\Delta V_{CE1} = - \Delta I_C R_E \quad (3)$$

As can be noted from this equation, in the prior art cascode transistor amplifier, the current feedback voltage provided by the emitter resistor 18 directly causes the variation in the collector-emitter voltage $V_{CE1}$ of the first stage transistor 14. This means an increase in the load resistance (the emitter resistor 18 can be regarded as a load resistance) of the first stage transistor. Accordingly, in the prior art cascode amplifier, the deformation of the output signal is large. Further, where a signal having a large amplitude is to be amplified it is necessary to increase the voltage of the source 16 for the following reason. In response to the input signal the emitter potential of the transistor 14 increases, but the collector voltage of transistor 14 must be higher than its emitter voltage. Accordingly, the voltage of the source 16 should be higher than the emitter voltage. For this reason, it is necessary to increase the source voltage E for an input having a large amplitude. However, as the source voltage is increased the collector-emitter voltage $V_{CE1}$ of the first stage transistor 14 increases in the absence of the input voltage with the result that the loss ($V_{CE1} \cdot I_C$) of the transistor 14 increases.

SUMMARY OF THE INVENTION

It is an object of this invention to provide an improved amplifier capable of operating stably.

Another object of this invention is to provide an amplifier capable of amplifying signals with a small deformation of the waveform.

Still another object of this invention is to provide an improved cascode transistor amplifier in which it is not necessary to vary the bias voltage in order to obtain proper response to a large amplitude input signal voltage.

A further object of this invention is to provide a low loss cascode transistor amplifier.

According to one aspect of this invention there is provided an amplifier device of the type comprising first and second cascode connected three electrode active semiconductor elements (either bipolar or field effect transistors) wherein control electrode (base or gate) of the first element is connected to a signal input terminal, the majority carrier input electrode (emitter or source) of the first element is connected to the ground through a resistor, the majority carrier output electrode (collector or drain) of the first element is connected to the majority carrier input electrode of the second element, and the majority carrier output electrode of the second element is connected to a voltage source via a resistor and to an output terminal, characterized in that the control electrode of the second element is connected to the majority carrier input electrode of the first element through a biasing circuit.

According to another aspect of this invention there is provided a pair of amplifiers each including first and second cascode connected three electrode active semiconductor elements, that the control electrodes of the first elements of the first and second amplifiers are connected to different signal input terminals respectively, that the majority carrier input electrodes of the first elements of the first and second amplifiers are commonly connected to a source of reference voltage through a constant current circuit, that the majority carrier output electrodes of the first elements of the first and second amplifiers are connected to the second terminals respectively of the second elements of the first and second amplifiers, that the control electrodes of the second elements of the first and second amplifiers are connected to the majority carrier input electrodes of the first elements via a biasing circuitry, that the majority carrier output electrodes of the second elements of the first and second amplifiers are connected to a voltage source respectively through resistors, and that the majority carrier output electrode of the second element of the second amplifier is connected to an output terminal whereby said pair of amplifiers constitutes a differential amplifier.

BRIEF DESCRIPTION OF THE DRAWINGS

Further objects and advantages of the invention can be more fully understood from the following detailed description taken in conjunction with the accompanying drawings in which.

DESCRIPTION OF THE PREFERRED EMBODIMENTS

Figure 1:
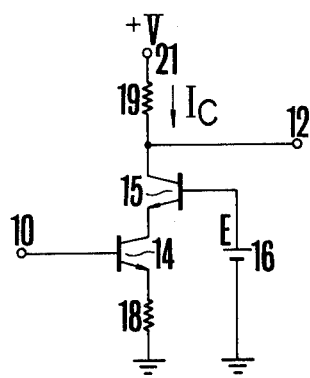
FIG. 1 is a connection diagram showing one example of a prior art cascode transistor amplifier.
Figure 2:
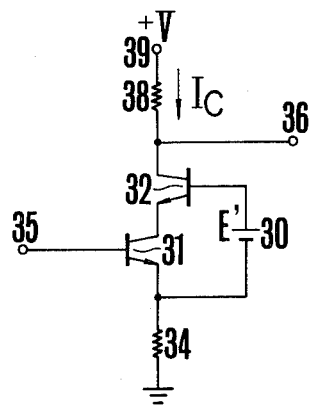
FIG. 2 is a connection diagram showing one example of the improved cascode transistor amplifier of this invention.

In a preferred embodiment of this invention shown in FIG. 2, a voltage source 30 is connected between the emitter electrode (also referred to as a majority carrier input electrode corresponding to a source electrode in a field effect transistor) of the first stage transistor 31 and the base electrode (also referred to as a control electrode) of the second stage transistor 32. The collector electrode (also referred to as a majority carrier output electrode corresponding to a drain electrode in a field effect transistor) of the first stage transistor 31 is directly connected to the emitter electrode of the second stage transistor 32. The emitter electrode of the first stage transistor 31 is grounded through an emitter resistor 34 and the base electrode is connected to an input terminal 35. The collector electrode of the second stage transistor 32 is connected to an output terminal 36 and to the positive terminal 39 of a source +V through a collector resistor 8. The collector-emitter voltage $V_{CE1}$ of the first stage transistor 31 and the base-emitter voltage $V_{BE2}$ of the second stage transistor 32 are supplied from the bias source 30 having a voltage E'.

In the cascode amplifier constructed as above described the bias source voltage E' is expressed by the following equation $$E' = V_{BE2} + V_{CE1}$$

Thus, $$V_{CE1} = E' - V_{BE2}$$

accordingly, even when the collector current $I_C$ varies in response to an input signal, the collector-emitter voltage $V_{CE1}$ of the first stage transistor 31 is constant. In other words, the operation of the first stage transistor 31 is not influenced by the change in the voltage drop across the emitter resistor 34 caused by the variation in the collector current $I_C$. Further, the load impedance of the first stage transistor 31 is determined by the $V_{BE2} - I_C$ characteristic and the constant voltage characteristic of the source and affected only a little by the variation in the collector current $I_C$, thereby maintaining a stable amplifying operation. Further, as it is possible to design such that $V_{CE1} = 0.6V$, $V_{BE2} = 0.6V$ and $E' = 1.2V$, the loss of the first stage transistor 31 can be reduced.

Figure 3:
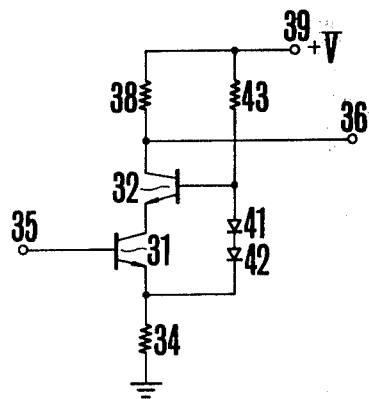
FIGS. 3 and 4 show modified embodiments of this invention.
Figure 4:
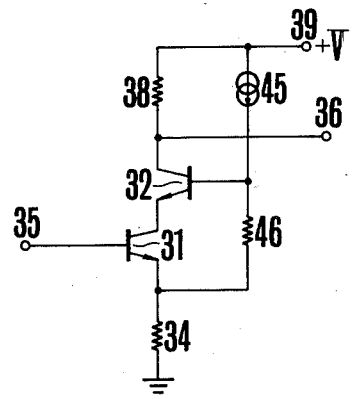

FIGS. 3 and 4 show additional embodiments of this invention. In FIG. 3 there is shown an example of a circuit utilizing the forward voltage drop of diodes 41 and 42 as the bias source 30 shown in FIG. 3, and the elements corresponding to those shown in FIG. 2 are designated by the same reference numerals. The base electrode of the second stage transistor 32 is connected to the positive terminal 39 of the source +V via a base resistor 43 and to the emitter electrode of the first stage transistor 31 via serially connected diodes 41 and 42 poled as shown.

In FIG. 4, the voltage drop across a resistor 46 connected in series with a constant current source 45 is utilized as the source 30 shown in FIG. 2. Again elements corresponding to those shown in FIG. 2 are designated by the same reference numerals. In the circuit shown in FIG. 4, the base electrode of the second stage transistor 32 is connected to the positive terminal 39 of the source +V through the constant current source 45 and to the emitter electrode of the first stage transistor 31 via resistor 46.

The cascode amplifiers shown in FIGS. 3 and 4 operate in the same manner as that shown in FIG. 2. Thus, the operation of the first and second stage transistors 31 and 32 are not affected by the voltage drop across the emitter resistor 34 caused by the variation in the collector current $I_C$. Moreover, the load impedance of the first stage transistor is determined by the constant voltage characteristic of the second stage transistor 32 so that it is possible not only to decrease the effect caused by the variation in the collector current $I_C$ but also to decrease the loss of the first stage transistor 31.

In the embodiments described above although cascode amplifiers utilizing NPN type bipolar transistors were illustrated it is also possible to use PNP type bipolar transistors or field effect type transistors (FET). If desired, transistors of different types may be combined to form a cascode amplifier. In any case, the operations of the amplifiers are similar to those of the illustrated amplifiers.

As above described, according to the cascode amplifier of this invention it is possible to make a stable amplification with a simple construction. Moreover the operation of the amplifier is not affected by the change in the voltage drop across the emitter resistor caused by the change in the collector current thereby assuring stable and accurate operation.

Figure 5:
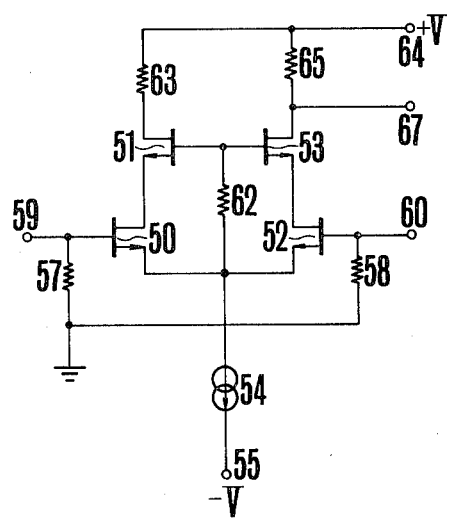
FIG. 5 is a connection diagram showing a differential amplifier utilizing the cascode amplifiers of this invention.
Figure 6:
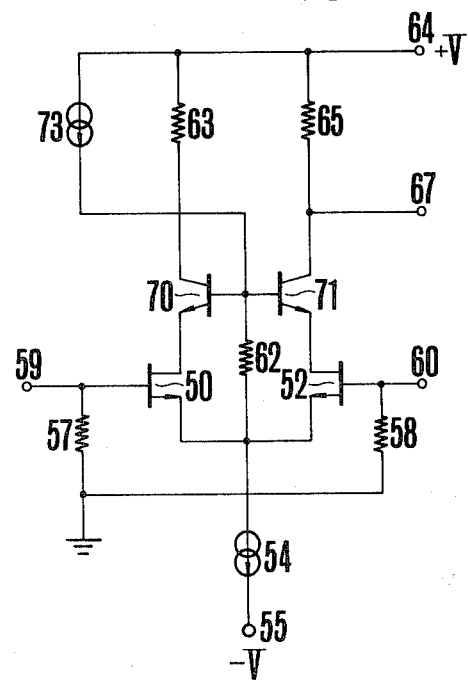
FIGS. 6 and 7 are connection diagrams showing modified differential amplifiers utilizing the cascode amplifiers of this invention.
Figure 7:
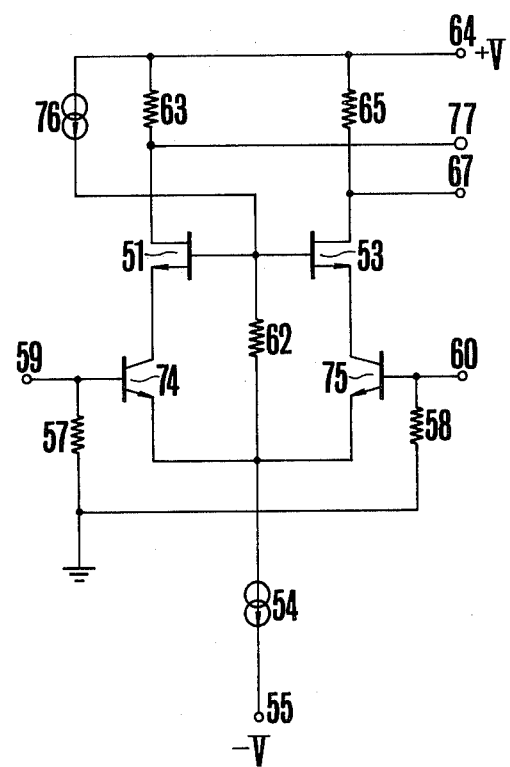

FIGS. 5 through 7 shown examples of differential amplifiers constructed, correct the spelling of cascode with cascode amplifiers of this invention.

In the embodiment shown in FIG. 5 two sets of cascode amplifiers are constituted by four junction N channel type field effect transistors 50, 51 and 52, 53 and the cascode amplifiers are connected to form a differential amplifier. The source electrodes of the transistors 50 and 52 are commonly connected to the negative terminal 55 of a source −V through a constant current circuit 54 while the gate electrodes of these transistors are grounded through resistors 57 and 58 respectively, and connected to input terminals 59 and 60, respectively. To the input terminal 59 is a applied an input signal while to the input terminal 60 is applied a negative feedback signal, for example, from a succeeding amplifier stage (where the circuit shown in FIG. 5 is used as an input stage amplifier of an audio amplifier circuit). A resistor 62 is connected between the commonly connected gate electrodes of the field effect transistors 51 and 53 and the commonly connected source electrodes of the field effect transistors 50 and 52. The drain electrode of the field effect transistor 51 is connected to the positive terminal 64 of a source +V via a resistor 63, whereas the drain electrode of the field effect transistor 53 is connected to the same terminal through a resistor 65. An output terminal 67 is connected between the juncture between the resistor 65 and the drain electrode of the field effect transistor 53.

The resistor 62 utilized in this circuit in accordance with this invention corresponds to the voltage source 30 shown in FIG. 2, so that the gate potential of the field effect transistor 51 and 53 follows the input signal. As a consequence, the potential difference between the source electrodes of the field effect transistors 50 and 52 and the gate electrodes of the field effect transistors 51 and 53 is not caused to vary by the amplitude of the input signal. In other word, each drain-source voltage of the field effect transistors 50 and 52 is constant.

In the embodiment shown in FIG. 6, the field effect transistors 51 and 53 shown in FIG. 5 are replaced by NPN type bipolar transistors 70 and 71. A constant current is passed through a resistor 62 from the positive terminal 64 of source +V via a constant current source 73 thus producing a constant voltage effect to maintain the drain-source voltage of the field effect transistors 50 and 52 and the base-emitter bias voltage of the transistors 70 and 71. Then it is possible to set the field effect transistors 50 and 52 at optimum operating points and to increase the degree of freedom of setting the operating points of the transistors 70 and 71.

In the embodiment shown in FIG. 7, the field effect transistors 50 and 52 shown in FIG. 5 are replaced by NPN type bipolar transistors 74 and 75. An output signal is provided between output terminals 67 and 77. The output terminal 77 is connected to the drain electrode of the field effect transistor 51. In the same manner as in FIG. 6, for the purpose of maintaining the collector-emitter voltage of transistors 74 and 75 and the gate-source voltage of the field effect transistors at the optimum operating points a constant current is passed through the resistor 62 from the positive terminal 64 of source +V via a constant current source 76 thereby always producing a constant voltage drop across the resistor 62. Other operations are similar to those of FIG. 5.

What is claimed is:

1. In an amplifier device of the type comprising first and second cascode connected three electrode active semiconductor elements each having a control electrode, a majority carrier input electrode and a majority carrier output electrode and wherein the control electrode of the first element is connected to a signal input terminal, the majority carrier input electrode of the first element is connected to a source of reference potential through resistance means, the majority carrier output electrode of the first element is connected to the majority carrier input electrode of the second element, and the majority carrier output electrode of the second element is connected to a voltage source via a resistor and to an output terminal, the improvement wherein the control electrode of said second element is connected back to the majority carrier input electrode of said first element through a constant current biasing circuit means without intervening impedance means.

2. The amplifier device according to claim 1 wherein each of said three terminal active semiconductor elements comprises a bipolar transistor.

3. The amplifier device according to claim 1 wherein each of said three terminal active semiconductor elements comprises a field effect transistor.

4. The amplifier device according to claim 1 wherein one of said three terminal active semiconductor elements comprises a bipolar transistor and the other element comprises a field effect transistor.

5. The amplifier device according to claim 4 wherein the control electrode of said bipolar transistor is connected to the input terminal and the majority carrier output electrode of said field effect transistor is connected to the output terminal.

6. The amplifier device according to claim 4 wherein the control electrode of said field effect transistor is connected to the input terminal and the majority carrier output electrode of said bipolar transistor is connected to the output terminal.

7. The amplifier device according to claim 1 wherein said biasing circuit comprises diode means energized by said voltage source.

8. The amplifier device according to claim 1 wherein said biasing circuit comprises a resistor connected to said voltage source via a constant current source.

9. An amplifier device comprising interconnected, first and second amplifiers, each amplifier including first and second cascode connected three electrode active semiconductor elements, each element having a control electrode, a majority carrier input electrode, and a majority carrier output electrode, the control electrodes of the first elements of the first and second amplifiers being connected to different signal input terminals, respectively, the majority carrier input electrodes of the first elements of the first and second amplifiers being directly interconnected with each other and commonly connected to a source of reference potential through a constant current circuit, the majority carrier output electrodes of the first elements of said first and second amplifiers being connected to the majority carrier input electrodes of the second elements of the first and second amplifiers, respectively, the control electrodes of the second elements of said first and second amplifiers being directly interconnected with each other and connected to the directly interconnected majority carrier input electrodes of said first elements of said first and second amplifiers, respectively, through a common biasing circuit without intervening impedance means, the majority carrier output electrodes of the second elements of the first and second amplifiers, respectively, being connected to a source of voltage through respective resistors, and the majority carrier output electrode of the second element of the second amplifier being connected to an output terminal whereby said interconnected first and second amplifiers form a differential amplifier.

10. The amplifier device according to claim 9 wherein said three electrode active semiconductor elements comprise bipolar transistors.

11. The amplifier device according to claim 9 wherein said three electrode active semiconductor elements comprise field effect transistors.

12. The amplifier device according to claim 9 wherein one of the three electrode semiconductor elements of each amplifier comprises a bipolar transistor and the other comprises a field effect transistor.

13. The amplifier device according to claim 9 wherein said biasing circuit comprises a resistor.

14. The amplifier device according to claim 13 which further comprises a constant current circuit connected between said source of voltage and the control electrodes of the second elements of the first and second amplifiers.

* * * * *